United States Patent
Grise et al.

(10) Patent No.: US 7,784,000 B2
(45) Date of Patent: Aug. 24, 2010

(54) IDENTIFYING SEQUENTIAL FUNCTIONAL PATHS FOR IC TESTING METHODS AND SYSTEM

(75) Inventors: Gary D. Grise, Colchester, VT (US); Vikram Iyengar, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 12/050,381

(22) Filed: Mar. 18, 2008

(65) Prior Publication Data

US 2009/0240459 A1  Sep. 24, 2009

(51) Int. Cl.
G06F 17/50 (2006.01)
(52) U.S. Cl. .............................. 716/4; 716/1
(58) Field of Classification Search ............ 716/1, 716/4
See application file for complete search history.

(56) References Cited

U.S. PATENT DOCUMENTS

| | | | |
|---|---|---|---|
| 6,178,534 B1 * | 1/2001 | Day et al. | 714/745 |
| 2006/0031728 A1 * | 2/2006 | Warren et al. | 714/724 |
| 2006/0247906 A1 * | 11/2006 | Austin et al. | 703/16 |
| 2007/0100586 A1 * | 5/2007 | Cheng et al. | 702/185 |
| 2007/0255988 A1 * | 11/2007 | Wang et al. | 714/726 |
| 2009/0070646 A1 * | 3/2009 | Wang et al. | 714/728 |
| 2009/0132880 A1 * | 5/2009 | Wang et al. | 714/731 |

* cited by examiner

*Primary Examiner*—Jack Chiang
*Assistant Examiner*—Suchin Parihar
(74) *Attorney, Agent, or Firm*—Ryan K. Simmons; Hoffman Warnick LLC

(57) ABSTRACT

A method and system of identifying sequential functional paths for IC testing methods are disclosed. In one embodiment, a method may include a method of sequential functional path identification for at-speed structural test, the method comprising: using a timing tool to enumerate a plurality of critical paths in a circuit; identifying which of the plurality of critical paths are sequential functional paths that will function during functional operation of the IC by identifying which of the plurality of critical paths a test can be generated for using a test sequence having n functional capture cycles, where n is greater than 2; performing path test generation for the sequential functional paths using launch-off-scan test sequences; and performing path test generation for critical paths not tested by the launch-of-scan test sequences, using launch-off-capture test sequences having two functional captures.

6 Claims, 3 Drawing Sheets

US 7,784,000 B2

IDENTIFYING SEQUENTIAL FUNCTIONAL PATHS FOR IC TESTING METHODS AND SYSTEM

BACKGROUND

1. Technical Field

The disclosure relates generally to integrated circuit (IC) chip testing, and more particularly, to a method and system of identifying sequential functional paths for IC testing.

2. Background Art

Integrated circuit (IC) chips are tested prior to being released for sale to ensure that they operate correctly. Conventionally, transition fault test patterns are generated using the easiest and shortest paths through combinational logic possible. Each transition fault test pattern attempts to test for faults by testing the delay at one internal node within the circuit. Many longer and more critical paths exist that may not be tested by these transition fault test patterns. These untested paths may fail at the customer in functional operation leading to unacceptably high failure rates. However, testing the infinite number of longer paths is currently impossible due to test time and test generation effort constraints. In addition, a number of these longer paths are false paths that do not need to be tested. For example, certain (Boolean false) paths will never be used during functional operation or testing of the circuit, and do not need to be considered during testing. In addition, in another example, certain (functionally false) paths are never used during functional operation of the IC, but may be sensitized during testing. As a result, a test resulting in a fault detection of a functionally false path may lead to unnecessarily rejecting good products.

SUMMARY

A method and system of identifying sequential functional paths for IC testing methods are disclosed. In one embodiment, a method may include a method of sequential functional path identification for at-speed structural test, the method comprising: using a timing tool to enumerate a plurality of critical paths in a circuit; identifying which of the plurality of critical paths are sequential functional paths that will function during functional operation of the IC by identifying which of the plurality of critical paths a test can be generated for using a test sequence having n functional capture cycles, where n is greater than 2; performing path test generation for the sequential functional paths using launch-off-scan test sequences; and performing path test generation for critical paths not tested by the launch-of-scan test sequences, using launch-off-capture test sequences having two functional captures.

A first aspect of the disclosure provides a method of sequential functional path identification for at-speed structural test, the method comprising: using a timing tool to enumerate a plurality of critical paths in a circuit; identifying which of the plurality of critical paths are sequential functional paths that will function during functional operation of the IC by identifying which of the plurality of critical paths a test can be generated for using a test sequence having n functional capture cycles, where n is greater than 2; performing path test generation for the sequential functional paths using launch-off-scan test sequences; and performing path test generation for critical paths not tested by the launch-of-scan test sequences, using launch-off-capture test sequences having two functional captures.

A second aspect of the disclosure provides a system of sequential functional path identification for at-speed structural test, the method comprising: means for enumerating a plurality of critical paths in a circuit; means for identifying which of the plurality of critical paths are sequential functional paths that will function during functional operation of the IC by identifying which of the plurality of critical paths a test can be generated for using a test sequence having n functional capture cycles, where n is greater than 2; means for performing path test generation for the sequential functional paths using launch-off-scan test sequences; and means for performing path test generation for critical paths not tested by the launch-of-scan test sequences, using launch-off-capture test sequences having two functional captures.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
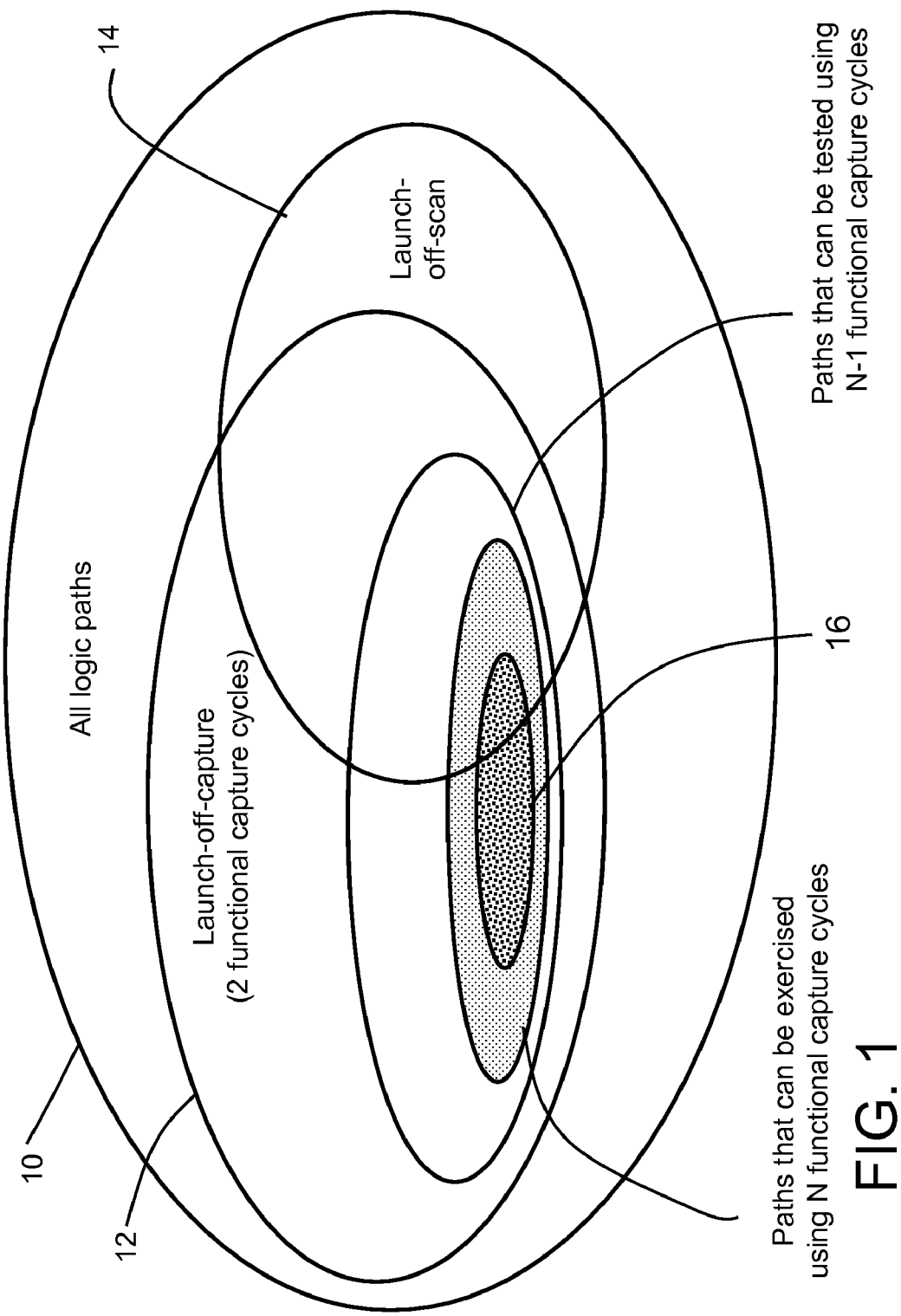
FIG. 1 shows a Venn diagram of the functional paths in a circuit according to the disclosure.

The disclosure addresses how to select or identify functional paths from an infinite number of logic paths on an integrated circuit (IC) for testing, such that the selected paths are most likely to be used during sequential functional operation in mission mode of the IC. In addition, the disclosure addresses how to test those selected paths to reduce test data volume. As used herein, "logic paths" are sequences of circuitry through an IC. In order to better select logic paths for testing, the disclosure focuses on selecting "functional paths" which are a subset of all of the logic paths of the IC. Functional paths are those paths that function during functional operation of IC 101 and include combinational logic and memory, i.e., they store data and may use the stored data to create an output from one or more inputs (latter referred to as sequential logic paths). Other logic paths may include only combinational logic and do not use memory, i.e., they create output(s) from one or more inputs.

As used herein, a logic path is "sensitized" when the memory elements present in the path take values, such that a logic transition at the input of the path passes through the path and can be measured at the output of the path. To test a logic path during testing, it is necessary to sensitize the path, such that a test logic transition can be applied at the input of the path, and measured at the output of the path. Similarly, for the path to function during functional operation, it is necessary to sensitize the path, such that a functional logic transition that appears at the input of the path can pass through to the output of the path. During testing, logic values may be input to these memory elements for the purpose of sensitizing the path for test. During functional operation, it may or may not be possible for the same logic values to appear within the same memory elements. Hence, during functional operation, a logic path that can be sensitized for testing, may or may not be sensitized.

A combinational functional path is one that is Boolean true and can be sensitized functionally if the memory elements present in the path are allowed to take any value required to sensitize the path. On the other hand, a sequential functional path is one that is also Boolean true and can be sensitized functionally only if the memory elements present in the path are allowed to take the values reachable in normal functional operation. The disclosure addresses how to select or identify only sequential functional paths from an infinite number of logic paths on an integrated circuit (IC) for testing, such that the selected paths are most likely to be used during sequential functional operation in mission mode of the IC. The sequential functional paths can be used for IC testing such as at-speed structural testing (ASST). IC 101 may be obtained from any now known or later develop design tool.

There are two types of test sequencing approaches currently employed that the present disclosure leverages. They are referred to as "launch-off-capture" test sequencing and "launch-off-scan" test sequencing. In "launch-off-capture" (LoC) test sequencing, a test pattern is scanned into all the latches on an IC. Then, a functional capture pulse is applied to all latches such that they capture input data from their functional ports. Multiple timed functional capture pulses, e.g., two, are then applied so that the delay from the outputs of source latches to the inputs of capture latches can be measured. The source test input data therefore comes from a functional capture, and is more like to functional data than arbitrary scan data. Hence, the scan test pattern has been transformed into a more functionally-useful test pattern using functional captures before the delay test capture. In "launch-off-scan" (LoS) test sequencing, a test pattern is scanned into all latches. Then, a single scan shift (not functional capture) launches the test transition. Only one functional capture is used (to measure the transition at the output of the path). LoS test sequences are more efficient for test pattern generation compared to LoC since they can manipulate scan data to test paths more readily. However, because of the "scan" flavor of LoS data, all the paths tested may not be exercised in functional operation.

FIG. 1 shows a Venn diagram illustrating the relative numbers of logic paths that can be sensitized by each type of testing. Set 10 illustrates all possible logic paths, set 12 shows those tested during LoC test sequencing using 2 functional cycles, and set 14 shows those tested during LoS test sequencing. In contrast, set 16 of sequential logic paths that will be used in functional operation is much smaller. As can be seen, LoC test sequencing set 12 is closer to functional operation set 16 since it uses two functional capture cycles compared to one by LoS test sequencing set 14.

Figure 2:
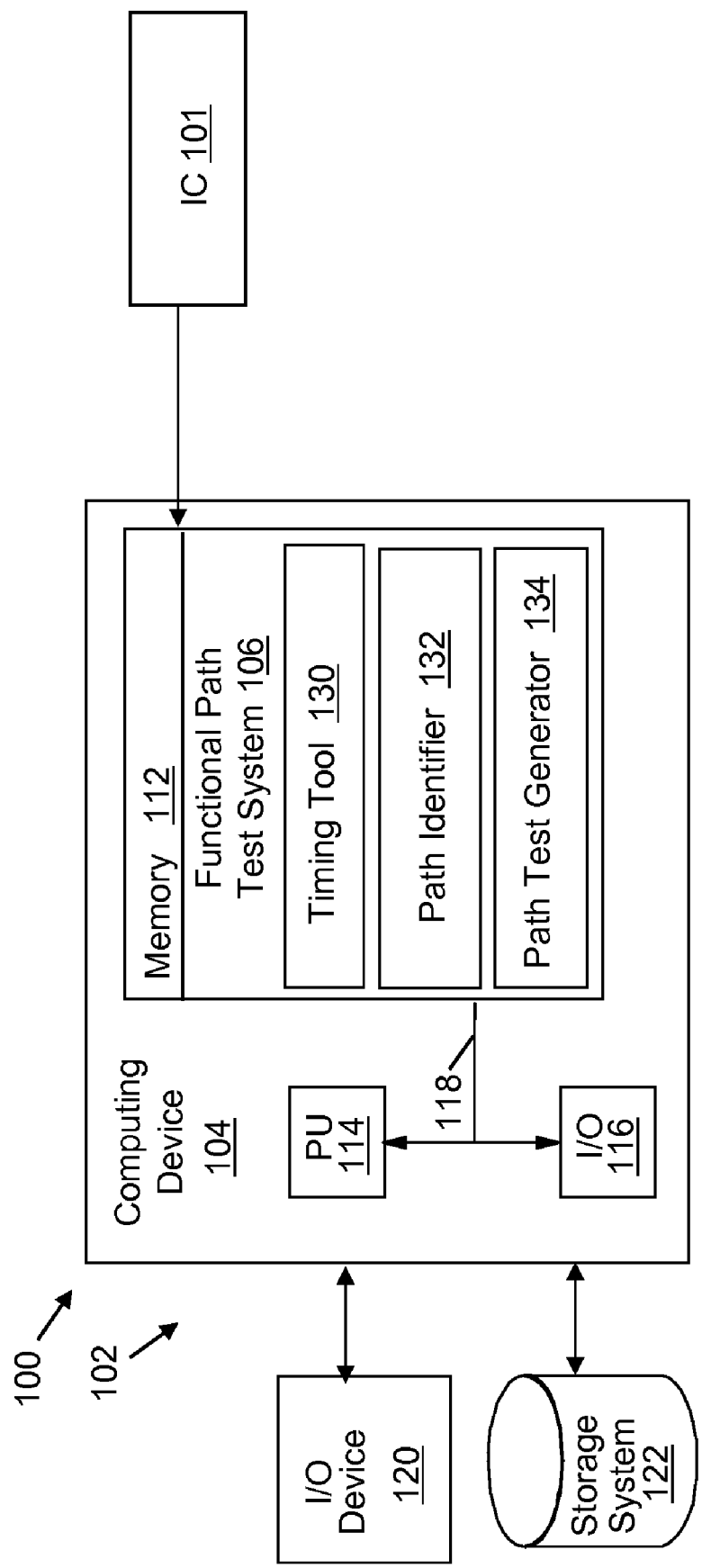
FIG. 2 shows a block diagram of a system according to the disclosure.

FIG. 2 shows an illustrative environment 100 for testing an IC 101. To this extent, environment 100 includes a computer infrastructure 102 that can perform the various process steps described herein for testing. In particular, computer infrastructure 102 is shown including a computing device 104 that comprises a functional path test system 106, which enables computing device 104 to perform the process steps of the disclosure.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as functional path test system 106, that is stored in memory 112 and/or storage system 122. While executing computer program code, processor 114 can read and/or write data, such as IC 101 design, to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and functional path system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As previously mentioned and discussed further below, functional path test system 106 enables computing infrastructure 102 to perform the processes described herein. To this extent, functional path test system 106 is shown including a timing tool 130, a path identifier 132 and a path test generator 134. Operation of each of these systems is discussed further below. However, it is understood that some of the various systems shown in FIG. 2 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 3:
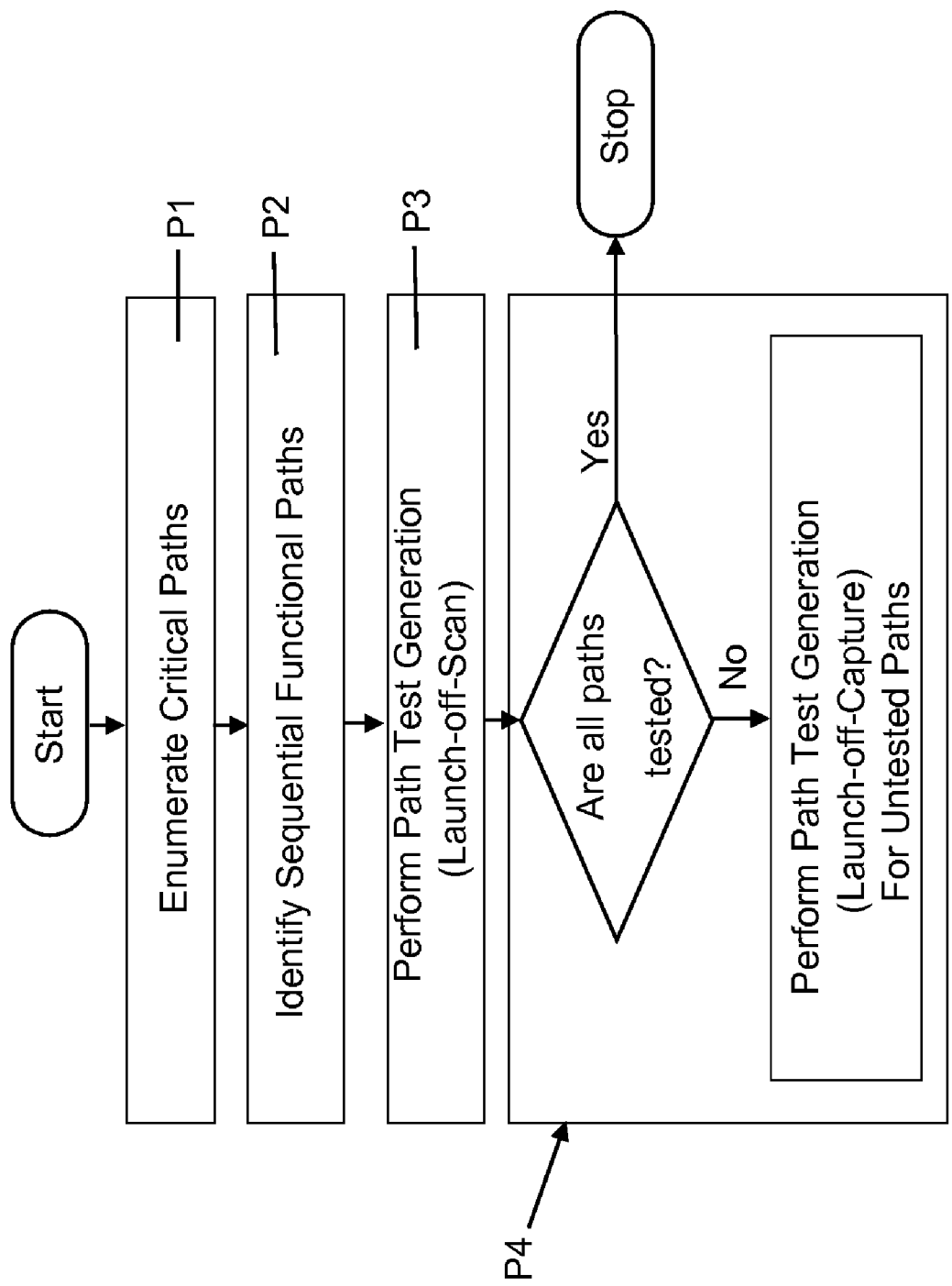
FIG. 3 shows a flow diagram of embodiments of a method according to the disclosure.

Turning to FIG. 3, embodiments of a method according to the disclosure are illustrated. In process P1, timing tool 130 enumerates a plurality of critical paths in a circuit. The timing tool may include any now known or later developed tool for performing static timing analysis (STA) or statistical static timing analysis (SSTA). As understood by those with skill in the art, a timing tool 130 does not consider any logic simulation or functional operation when listing critical paths in IC 101. Hence, of the millions of critical paths reported by timing tool 130, only a few will be exercised during functional operation of IC 101. Testing all of the critical paths is time and test generation effort resource intensive.

In process P2, path identifier 132 identifies which of the plurality of critical paths are sequential functional paths that will function during functional operation of the IC. Process P2 may include path identifier 132 identifying which of the plurality of critical paths can be sensitized using a test sequence having n functional capture cycles, where n is greater than 2. Ideally, n should be as large as possible, e.g., 16, 32, etc. In practice, n typically is 8 or 16. Process P2 may be performed using a couple of approaches. In one embodiment, a large number r of random test patterns having n functional capture cycles are simulated by path identifier 132 and those critical paths, which experience robust transitions, i.e., can be tested, when those r random patterns are applied are identified. That is, a large number r of random test patterns having n functional capture cycles are run on IC 101 and those critical paths that could be tested are identified as sequential functional paths, and those critical paths that could not be tested are not identified. Again, sequential functional paths are a subset of all of the logic paths of the IC that include combinatorial logic and memory. In another embodiment, path identifier 132 attempts to deterministically generate a test pattern having n functional capture cycles for each of the plurality of critical paths. Those paths that can be tested (have a deterministic test pattern having n functional capture cycles therefor) are identified as the sequential functional paths. The latter embodiment requires more computation effort by path identifier 132, but the former embodiment may result in missing some sequential functional paths.

In process P3, path test generator 134 performs path test generation for the sequential functional paths identified in process P2, using LOS test sequences. As noted above, LoS test sequencing includes using a test pattern scanned into latches of IC 101. Then, a single scan shift (not functional capture) launches the test transition. One functional capture is then used to measure the responses of the test. The computation effort, test generation time, and test data volume required for LoS is significantly less than for LoC, since only one functional capture is used. Hence, using LoS to first test the sequential functional paths identified by process P2 reduces the computation effort, test generation time, and test data volume.

In process P4, path test generator 134 performs (clean-up) path test generation for the critical paths not tested by process P3 using LoC test sequences having two functional captures. P4 may determine whether any critical paths were not tested. If all paths were tested, then processing stops. As noted above, in LoC test sequencing, a test pattern is scanned into all the latches on an IC. Then, a functional capture pulse is applied to all latches such that they capture input data from their functional ports. Multiple timed functional capture pulses, e.g., two, are then applied so that the delay from the outputs of source latches to the inputs of capture latches can be measured. The source test input data therefore comes from a functional capture, and is closer to functional data than arbitrary scan data. Hence, the scan test pattern has been transformed into a more functionally-useful test pattern using functional captures before the delay test capture. Hence, certain functional paths, such as the functional FFFF to 0000 transition in a 4-bit counter that cannot be tested by LoS because of scan chain contiguity can be tested by LoC. LoC is therefore used for clean-up test generation after LoS to test the sequential functional paths that are untested by LoS.

Subsequent to the above processes, ASST testing of IC 101 can be performed using the LoS and LoC test patterns generated in processes P3 and P4.

As discussed herein, various systems and components may "obtain" data (e.g., IC 101, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to perform the methods described herein. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as memory 122, magnetic tape, a removable computer diskette, a random access memory (RAM), a read-only memory (ROM), a tape, a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processing unit 114 coupled directly or indirectly to memory elements through a system bus 118. The memory elements can include local memory, e.g., memory 112, employed during actual execution of the program code, bulk storage (e.g., memory system 122), and cache memories which provide temporary storage of at least some program code in order to reduce the number of times code must be retrieved from bulk storage during execution.

In another embodiment, the disclosure provides a method of generating a system for performing the methods described herein. In this case, a computer infrastructure, such as computer infrastructure 102 (FIG. 2), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider, could offer to perform the methods as described herein. In this case, the service provider can manage (e.g., create, maintain, support, etc.) a computer infrastructure, such as computer infrastructure 102 (FIG. 2), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The methods as described above are used in the fabrication and/or testing of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of sequential functional path identification for at-speed structural test performed on at least one computing device, the method comprising:
    using a timing tool to enumerate a plurality of critical paths in a circuit;
    identifying, using the at least one computing device, which of the plurality of critical paths are sequential functional paths that will function during functional operation of the IC by identifying which of the plurality of critical paths a test can be generated for using a test sequence having n functional capture cycles, where n is greater than 2;
    performing, the at least one computing device, path test generation for the identified sequential functional paths using launch-off-scan test sequences, the launch-off-scan test sequences including applying a single scan shift to all latches in the IC, wherein the single scan shift launches a test transition; and
    after the performing of the path test generation using the launch-off scan test sequences, performing, using the at least one computing device, path test generation for critical paths included in the plurality of critical paths not identified and not tested by the launch-off-scan test sequences using launch-off-capture test sequences having two functional captures, the launch-off-capture test sequences including applying a functional capture pulse to the all of the latches in the IC such that the launch-off-capture test captures input data from each functional port of each of the latches.

2. The method of claim 1, wherein the identifying includes simulating a plurality of random test patterns having n functional capture cycles and identifying as sequential functional paths those critical paths that can be tested using the plurality of random test patterns.

3. The method of claim 1, wherein the identifying includes attempting to deterministically generate a test pattern having n functional capture cycles for each of the plurality of critical paths, and identifying as sequential functional paths those critical paths that have a deterministic test pattern having n functional captures generated.

4. A system of sequential functional path identification for at-speed structural test, the system comprising:
    a component for enumerating a plurality of critical paths in a circuit;
    a component for identifying which of the plurality of critical paths are sequential functional paths that will function during functional operation of the IC by identifying which of the plurality of critical paths a test can be generated for using a test sequence having n functional capture cycles, where n is greater than 2;
    a component for performing path test generation for the identified sequential functional paths using launch-off-scan test sequences, the launch-off-scan test sequences including applying a single scan shift to all latches in the IC, wherein the single scan shift launches a test transition; and
    a component for, after the performing of the path test generation using the launch-off scan test sequences, performing path test generation for critical paths included in the plurality of critical paths not identified and not tested by the launch-off-scan test sequences using launch-off-capture test sequences having two functional captures, the launch-off-capture test sequences including applying a functional capture pulse to the all of the latches in the IC such that the launch-off-capture test captures input data from each functional port of each of the latches.

5. The system of claim 4, wherein the identifying means simulates a plurality of random test patterns having n functional capture cycles and identifies as sequential functional paths those critical paths that can be tested using the plurality of random test patterns.

6. The system of claim 4, wherein the identifying means attempts to deterministically generate a test pattern having n functional captures for each of the plurality of critical paths, and identify as sequential functional paths those critical paths that have a deterministic test pattern generated.

* * * * *